(12) United States Patent
Takahashi et al.

(10) Patent No.: US 8,053,955 B2
(45) Date of Patent: Nov. 8, 2011

(54) PIEZOELECTRIC DEVICE AND METHOD OF PRODUCTION THEREOF

(75) Inventors: Shuji Takahashi, Kanagawa (JP); Fumihiko Mochizuki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 248 days.

(21) Appl. No.: 12/405,714

(22) Filed: Mar. 17, 2009

(65) Prior Publication Data
US 2009/0236933 A1 Sep. 24, 2009

(30) Foreign Application Priority Data
Mar. 21, 2008 (JP) .................. 2008-072769

(51) Int. Cl.
*H01L 41/047* (2006.01)

(52) U.S. Cl. ........................................ 310/363
(58) Field of Classification Search .................. 310/320, 310/321, 324, 363
See application file for complete search history.

(56) References Cited

U.S. PATENT DOCUMENTS

| 6,142,614 A | 11/2000 | Hashizume et al. | |
|---|---|---|---|
| 2006/0208618 A1* | 9/2006 | Murai et al. | 310/363 |
| 2007/0194662 A1* | 8/2007 | Sano et al. | 310/324 |
| 2008/0231146 A1* | 9/2008 | Izumi et al. | 310/358 |

FOREIGN PATENT DOCUMENTS

| JP | 8-181126 A | 7/1996 |
|---|---|---|
| JP | 10-211701 A | 8/1998 |
| JP | 2000-22090 A | 1/2000 |
| JP | 2000-183287 A | 6/2000 |
| JP | 2007-276384 A | 10/2007 |

* cited by examiner

*Primary Examiner* — Derek Rosenau
(74) *Attorney, Agent, or Firm* — Birch, Stewart, Kolasch & Birch, LLP

(57) ABSTRACT

A piezoelectric device includes a lower electrode, a piezoelectric film and an upper electrode laminated in this order on a support. An oxide film containing a material that forms a lower electrode is formed on a side surface of the piezoelectric film. The piezoelectric device is produced such that an upper electrode and a piezoelectric film are patterned by dry-etching through a mask formed on a side of the upper electrode of the piezoelectric device member and thereafter a side surface of the patterned piezoelectric film (a film adhered to a side wall) is oxidized to form an oxide film.

4 Claims, 4 Drawing Sheets

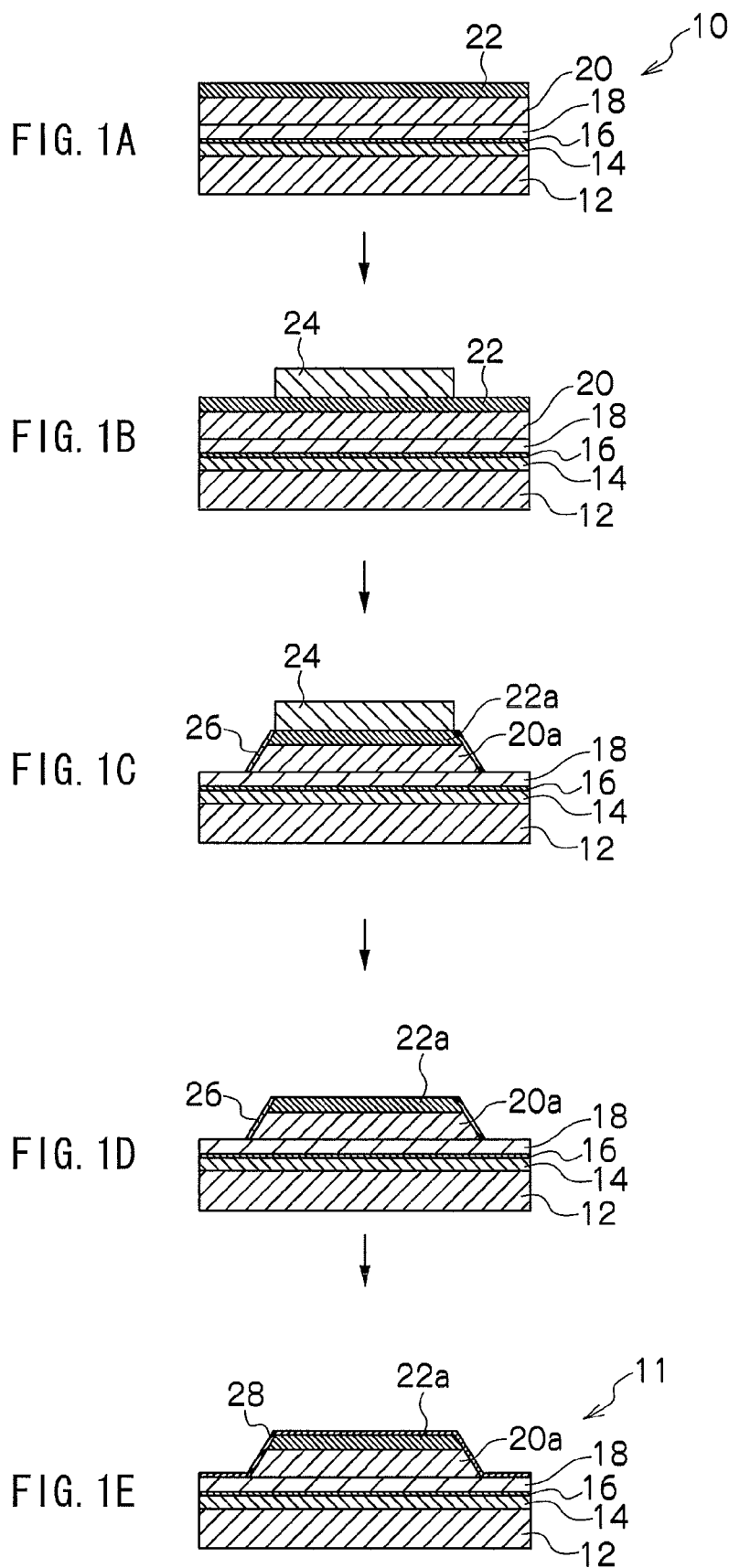

PIEZOELECTRIC DEVICE AND METHOD OF PRODUCTION THEREOF

CROSS-REFERENCE TO RELATED APPLICATION

This application is based on and claims priority under 35 USC 119 from Japanese patent Application No. 2008-072769 filed on Mar. 21, 2008, the disclosure of which is incorporated herein by reference in its entirety.

BACKGROUND OF THE INVENTION

1. Field of the Invention

The present invention relates to a piezoelectric device and a method of production thereof.

2. Description of the Related Art

In inkjet heads, piezoelectric bodies and semiconductor devices such as FeRAMs and MRAMs, a piezoelectric film, a magnetic body and an electrode material such as platinum are used (refer to, for example, Japanese Patent Application Laid-Open (JP-A) Nos. 10-211701 and 2007-276384). These are called "hard-to-etch" materials and are difficult to process. In general, when a hard-to-etch material is processed, a dry etching process is frequently used. When a hard-to-etch material is etched, a gas containing halogen is frequently used. Examples of the gas containing halogen include mixed gases containing halogenous gases such as fluorine-based gases or chlorine-based gases and the inert gas argon, and mixed gases containing fluorine-based gases and chlorine-based gases.

When a piezoelectric film is dry etched, a resist is patterned on an etching surface to form a mask and dry etching is applied through the resist mask, whereupon a reaction product is generated at the time of etching which is non-volatile and tends to adhere to a side surface of the mask.

Furthermore, if over etching is performed, a lower electrode is sputter-etched and tends to adhere to a side wall of the patterned piezoelectric film. In this case, a film is formed by material adhering to a side wall of the piezoelectric film due to etching of a lower electrode (a film adhered to side wall). This film is electroconductive, and a leak current between a lower electrode and an upper electrode is therefore problematic. Various methods have been proposed to inhibit the upper and lower electrodes from short-circuiting due to the film adhered to the side wall.

JP-A No. 2000-22090 discloses a method in which, when an upper electrode, a ferroelectric material and a lower electrode are dry-etched, the upper electrode is dry-etched with an oxide film mask, an oxide film mask and a resist mask for the ferroelectric material and lower electrode are formed so as to cover the remaining oxide film mask, and the ferroelectric material and the lower electrode are then etched.

JP-A No. 2000-183287 discloses a method in which an inert gas and a halogen gas are used to etch a dielectric film formed on a lower electrode up to the middle thereof, followed by etching the remaining dielectric film and over-etching the lower electrode with only halogen gas, further followed by cleaning with a peeling agent such as water or hydrochloric acid to remove a residue generated by the etching.

JP-A No. 8-181126 discloses a method where, after an anti-etching mask is formed with SOG (Spin On Glass) or the like on a ferroelectric film such as PZT (lead zirconate titanate), an inert gas and a halogen gas are used to perform dry etching and a deposit adhered to a side wall of the ferroelectric film during etching is removed with water or the like.

According to the method disclosed in JP-A No. 2000-22090, an etching mask is formed a plurality of times and an upper electrode and a dielectric material are separately etched; accordingly, processing becomes complicated and costs increase greatly due to an increase in processing steps.

According to the method disclosed in JP-A No. 2000-183287, when a strong acid or a special peeling agent is used, a lower electrode and a dielectric film may be damaged. On the other hand, when water is used, a film adhered to a side wall may not be sufficiently removed.

According to the method disclosed in JP-A No. 8-181126, the processes involved in forming a mask increase because a hard mask is formed from SOG (or the process of forming a mask becomes complicated), and it is also difficult to remove a mask after etching.

SUMMARY OF THE INVENTION

The present invention provides a piezoelectric device with a high reliability in inhibiting upper and lower electrodes from short-circuiting, and a method of production of the piezoelectric device which enables the piezoelectric device to be easily produced.

According to a first aspect of the invention, there is provided a piezoelectric device which is described below.

The present invention provides a piezoelectric device that includes a lower electrode, a piezoelectric film, and an upper electrode, laminated in this order on a support, in which an oxide film including a material forming the lower electrode is formed on a side surface of the piezoelectric film.

According to a second aspect of the invention, there is provided a method of production of the piezoelectric device described below.

A method of producing a piezoelectric device includes:

forming, on a side of an upper electrode of a piezoelectric device member in which a lower electrode, a piezoelectric film and an upper electrode are laminated in this order on a support, a mask for patterning the upper electrode and the piezoelectric film;

dry-etching the upper electrode, the piezoelectric film and a part of the lower electrode through the mask to pattern the upper electrode and the piezoelectric film; and performing an oxidation process for oxidizing at least a side surface of the patterned piezoelectric film.

According to the invention, there are provided a piezoelectric device high in reliability in inhibiting upper and lower electrodes from short-circuiting, and a method of production of the piezoelectric device, which enables the piezoelectric device to be easily produced.

BRIEF DESCRIPTION OF THE DRAWINGS

FIGS. 1A to 1E are diagrams showing the production process of a piezoelectric device in a first embodiment.

DETAILED DESCRIPTION OF THE INVENTION

Figure 2A:
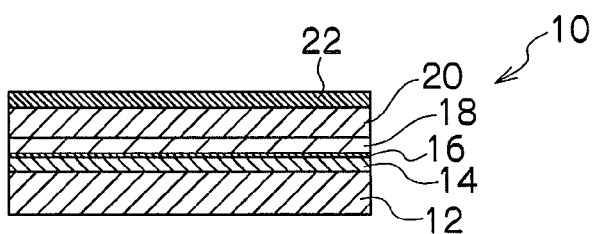
FIG. 2A to 2E are diagrams showing the production process of a piezoelectric device in a second embodiment.
Figure 2B:
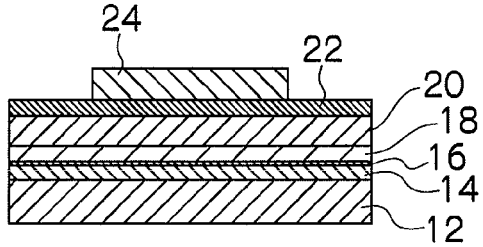

Below, the present invention will be described with reference to the drawings.

First Exemplary Embodiment

A production process of a piezoelectric device of a first embodiment will be described with reference to FIGS. 1A to 1E.

<Piezoelectric Device Member>

First, a member (piezoelectric device member) 10 for producing a piezoelectric device is prepared (FIG. 1A).

The configuration of the piezoelectric device member 10 is not particularly restricted, and a member having a layer structure corresponding to a desired device may be used. In the piezoelectric device member 10 in the present embodiment, an insulating film 14, an adherent layer 16 (such as Ti) and a lower electrode 18 (such as a noble metal film) are sequentially formed on a silicon substrate 12 (support). A piezoelectric film 20 is then formed on the lower electrode 18, and an upper electrode 22 (such as a noble metal film) is formed thereon.

As the insulating film 14, for example, a silicon oxide film ($SiO_2$) may be formed by a sputtering method, a CVD method or a thermal oxidation method. The lower electrode 18 and the upper electrode 22 may include Pt, Ir, Ru or oxides thereof and may be formed by a sputtering method or a CVD method. The piezoelectric film 20 may include PZT or the like and may be formed by a sputtering method, CVD, or the like.

Next, using the above piezoelectric device member 10 (hereinafter sometimes referred to as "substrate"), the upper electrode 22 and the piezoelectric film 20 are patterned by dry etching according to a method described below.

<Formation of Mask>

A mask 24 (a photosensitive resin layer) for patterning the upper electrode 22 and piezoelectric film 20 is formed by resist patterning on an upper electrode 22 side of the piezoelectric device member 10 (see FIG. 1B).

The mask 24 may be formed with a resist (a negative resist or positive resist). For example, an OFPR series or TSMR series resist (trade name, manufactured by Tokyo Ohka Kogyo Co., Ltd.) or an AZ1500 or 10XT resist (trade name, manufactured by AZ Corporation) may be used. A resist was coated on the upper electrode 22 by a known method such as a spin coat method or a spray coat method, followed by performing a soft bake (pre-bake).

The resist functions as a mask at the time of dry etching and is formed with a thickness, for instance, substantially from 0.1 to 20 μm after a soft bake so as to be readily removed after the dry etching. The soft bake is performed with a heating device such as a hot plate or an oven and at a temperature and time appropriate for a resist material (for example 60° C. to 150° C., for from 1 to 15 minutes).

Next, the resist is patterned as a mask by photolithography (exposure and development). Upon exposure, an aligner or a stepper is used via a photomask so that a developed resist mask 24 may retain a shape corresponding to pattern shapes of the upper electrode 22a and piezoelectric film 20a after dry etching. The exposure amount may vary depending on the resist material to be used.

After the exposure, development is carried out. Depending on the resist used, a post exposure bake (PEB) may be performed before development. By performing a PEB before development, exposure deficiencies may be alleviated and a deformation of the pattern shape due to a standing wave upon exposure may be alleviated.

In the development, the exposed substrate 10 is immersed in a development liquid, followed by rinsing with pure water, further followed by drying the substrate 10. For example, the exposed substrate 10 is immersed for substantially 60 seconds in an alkaline development liquid such as NMD-3 (trade name, manufactured by Tokyo Ohka Kogyo Co., Ltd.), followed by rinsing with pure water for 60 seconds twice, further followed by removing moisture adhered to the substrate 10 by a spin dryer.

The post bake is performed preferably after patterning of the resist. The substrate 10 is heated by use of a heating device such as a hot plate or an oven. By conducting the post bake of the resist 24, remaining development liquid and rinsing liquid are vaporized and removed, and the resist 24 is cured to improve the plasma resistance thereof during dry etching and adhesiveness with respect to the substrate 10. The post bake temperature and time may be set in accordance with the resist material and are usually set substantially from 100° C. to 200° C. and from 1 to 60 minutes. UV curing may be conducted in place of the post bake.

<Dry Etching>

Next, the upper electrode 22, piezoelectric film 20 and a part of the lower electrode 18 are dry-etched through a mask 24 to pattern the upper electrode 22 and piezoelectric film 20 (see FIG. 1C).

A dry etching method may be selected according to the material to be patterned by etching. Inductively coupled plasma (ICP), electron cyclotron resonance plasma (ECP), helicon wave plasma (HWP), magnetic field reinforcing ICP, or the like may be used to conduct dry etching.

Figure 3:
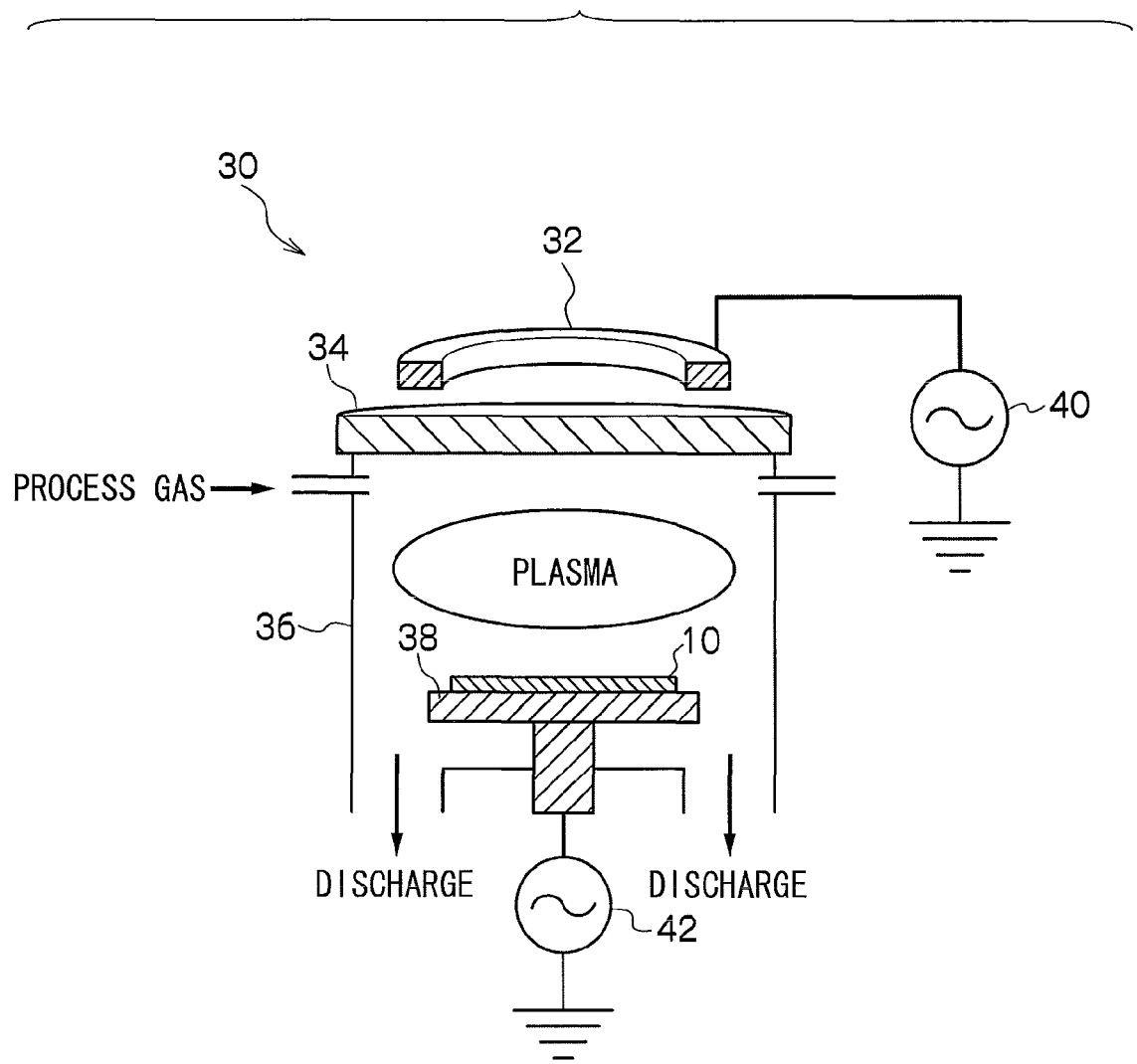
FIG. 3 is a schematic constitutional diagram showing an example of a dry etching unit.

If a PZT film is used as a piezoelectric film 20, dry etching may be performed by conducting plasma etching with a dry etching unit 30 provided with an antenna 32 and a dielectric window 34 as shown in FIG. 3. A mixed gas including, for instance, chlorine and argon may be introduced into a chamber 36 as a process gas. As the process gas, in place of chlorine, $BCl_3$, HBr, $SF_6$, $CF_4$, $CHF_3$ or $C_4F_8$ may be used, and oxygen or nitrogen may be added thereto. Furthermore, a plurality of gases may be mixed and used, such as a mixed gas including chlorine, $C_4F_8$, Ar and oxygen. An RF (radio frequency) is applied to the antenna 32 to generate a plasma and a bias RF is applied to a stage 38 to conduct etching. For instance, for an RF power source 40 for the antenna 32, 13.56 MHz is used and, for an RF power source 42 for bias, a low frequency band is used. For an RF frequency for the antenna 32, 13.56 to 60 MHz may be used. For a low frequency power source, 350 kHz to 2 MHz may be used. Typical etching conditions are as described below.

As the process gas, a mixed gas containing 10% to 60% of chlorine and 40% to 90% of argon is used. A flow rate of chlorine may be set at 20 sccm and a flow rate of argon may be set at 80 sccm. A pressure of the process gas may be set at from 0.1 Pa to 5 Pa, for example, 1.0 Pa. The antenna RF power is set at from 350 W to 1000 W. for example, 500 W. The substrate bias power is set at from 50 W to 500 W. for example, 150 W. The temperature of the stage 38 may be set at from −20° C. to 150° C., for example, 5° C.

After the upper electrode 22 is etched, the piezoelectric film 20 is also etched. An emission spectrometric end point detection method may be used to detect an end point of the etching. If the upper electrode 22 is, for instance, Pt, an emission wavelength at 341 nm may be monitored to detect an end point of the etching; if it is Ir, an emission wavelength at 351 nm, 393.4 nm, 410.8 nm or 415.4 nm may be monitored to detect an end point of the etching, and if the piezoelectric film 20 is a PZT film, an emission wavelength at 406 nm of Ti may be monitored to detect an end point of the etching.

When the upper electrode 22 and piezoelectric film 20 are patterned by dry-etching in this manner, ideally, only the upper electrode 22 and piezoelectric film 20 are etched and etching ceases above the lower electrode 18. However, it is necessary to perform etching (over-etching) beyond a thickness of the piezoelectric film 20 so as to achieve in-plane uniformity in particular. The lower electrode 18 is partially sputter-etched by the over-etching, and a material forming the lower electrode 18 thus adheres to a side surface of the patterned piezoelectric film 20a to form a film 26 adhered to sidewall, a film thickness of which is substantially from several nanometers to several tens of nanometers.

<Removal of Mask>

The upper electrode 22 and piezoelectric film 20 are dry-etched to form patterned upper electrode 22 and piezoelectric film 20, respectively. Thereafter, the mask 24 is removed (peeled) (FIG. 1D).

Ashing is conducted with oxygen plasma to remove the resist mask 24. In the ashing that uses oxygen plasma, an ICP, microwave asher or barrel asher may be used. The ashing may be conducted with microwave-excited surface wave plasma (SWP) that uses a microwave under conditions of an oxygen gas of 200 sccm, 0 Pa and a microwave output of 1 kW. A polymer removal liquid may be used to remove residue, as required.

When the mask 24 is removed in this manner, a material that forms the mask 24 is inhibited from mixing with an oxide film (insulating film) 28 formed by a subsequent oxidation process.

<Oxidation Process>

A side surface of at least a patterned piezoelectric film 20a is oxidized after the resist mask 24 is removed (see FIG. 1E).

Herein, a method capable of oxidizing a side surface of the piezoelectric film 20a (film 26 adhered to sidewall) at a temperature as low as possible is preferred. When the piezoelectric film 20a such as a PZT film is exposed to a temperature as high as 400° C. or more, the performance of the film tends to deteriorate. Furthermore, when a high temperature process is applied to a substrate having a structure such as MEMS (Micro Electro Mechanical Systems) such as an inkjet head, problems such as warpage of the substrate and film peeling may be caused by thermal stress.

In order to inhibit problems like this from occurring, a plasma oxidation method, an ozone oxidation method or a UV oxidation method is more preferable than a thermal oxidation method (dry oxidation, wet oxidation). Of these methods, a plasma oxidation method is particularly preferable. When a plasma oxidation method is used, the film 26 adhered to the side wall may be oxidized at a relatively low temperature of 400° C. or lower.

The oxidation is performed so as to oxidize at least the film 26 adhered to the side wall. A film thickness of the film 26 adhered to the side wall is substantially from several nanometers to several tens of nanometers (usually 50 nm or less). The respective film thicknesses of the upper electrode 22 and lower electrode 18 are usually substantially from 100 nm to 200 nm. Accordingly, even after oxidation by a plasma oxidation method to oxidize the film 26 adhered to the side wall, the electroconductivity of the electrodes 22 and 18 may be maintained.

In the plasma oxidation method, microwave-excited plasma is used and oxygen plasma is generated from oxygen gas. A bias may be applied to a side of the substrate 10 as required. As a plasma source, high density plasma is preferred. For example, an ICP that uses RF, or an ICP to which a magnetic field is added, or an ECR (electron cyclotron resonance) plasma or an SWP (surface-wave-sustained plasma) that uses a microwave may be used. For instance, "MARORA" (trade name, manufactured by Hitachi Kokusai Electric Inc.) may be used.

Figure 4:
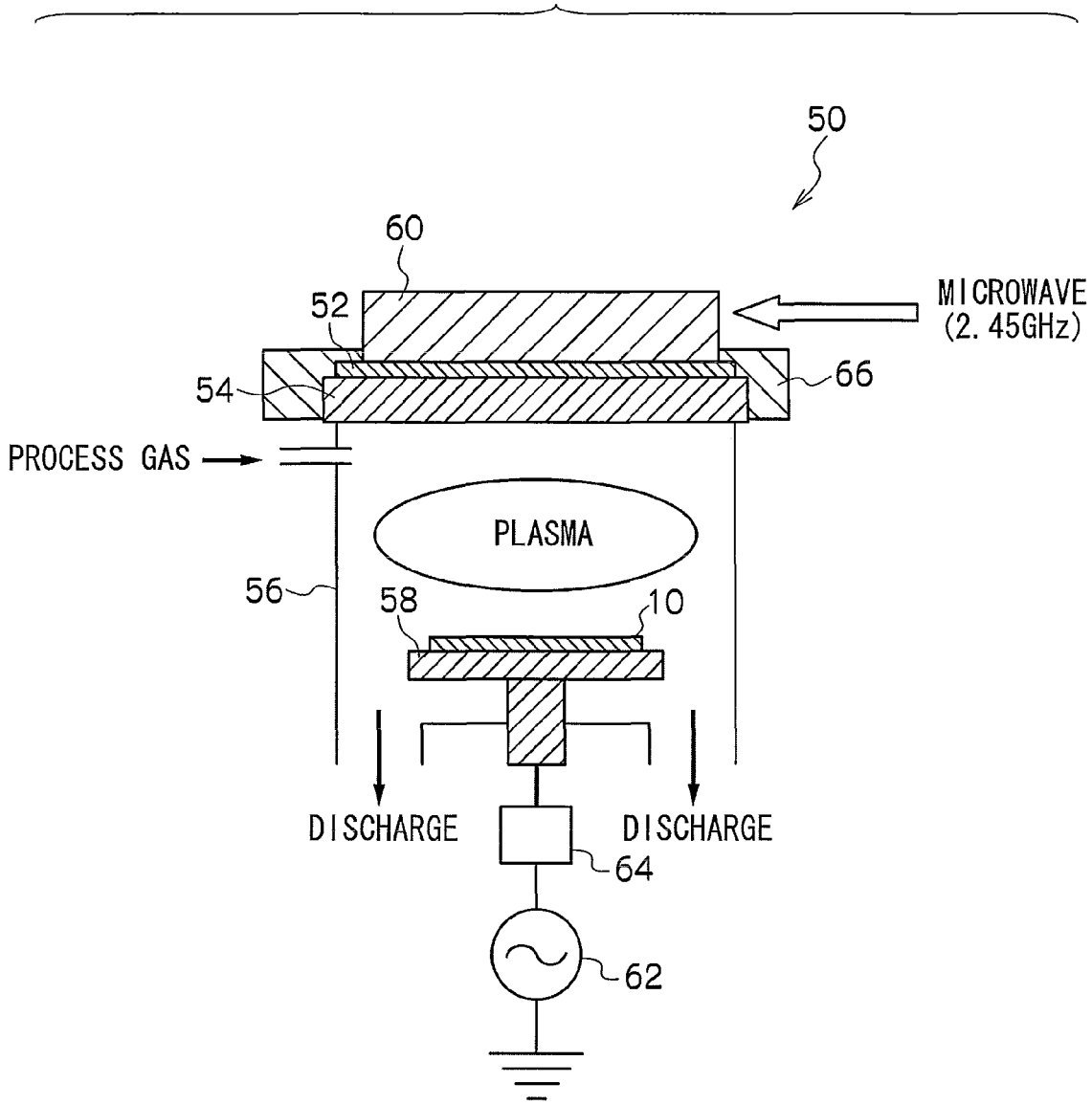
FIG. 4 is a schematic constitutional diagram showing an example of a microwave-excited surface wave plasma unit.

Furthermore, for instance, a microwave-excited surface wave plasma unit 50 having a configuration such as shown in FIG. 4 may be used. In the unit 50, a matching box 64 and a stage 58 connected to a bias power source 62 are disposed in a chamber 56 and a top board 66 above the stage 58 is provided with a waveguide tube 60, a slot antenna 52 and a dielectric window 54. When a substrate 10 is set on the stage 58, a process gas is introduced under reduced pressure and a microwave of 2.45 GHz is applied through the slot antenna 52 from above the chamber 56 to a dielectric window (quartz), and surface wave oxygen plasma is generated below the dielectric window 54.

As plasma oxidation conditions, for example, a gas such as oxygen or a mixed gas of oxygen and an inert gas such as argon, helium or krypton may be used. A gas flow rate (total flow rate) may be set at from 10 to 2000 sccm (such as 500 sccm of oxygen or 100 sccm of oxygen +900 sccm of argon), pressure may be set at from 0.5 to 665 Pa (such as 133 Pa), a microwave or RF output (output of a plasma generating power source) may be set at from 500 to 3000 W (bias may be applied to the substrate), and a substrate temperature may be set at from room temperature to 450° C., preferably 400° C. or less.

A piezoelectric device 11 is obtained by performing the processes mentioned above. In the piezoelectric device 11, an oxide film 28 containing a material that forms a lower electrode 18 is formed on a side surface of the piezoelectric film 20a. Since the oxide film 28 is an insulating film, the upper and lower electrodes 22 and 18 are inhibited from short-circuiting therebetween, and the oxide film 28 functions as a protective film against moisture, and thereby a piezoelectric device with a high reliability is obtained.

Second Embodiment

A production process of a piezoelectric device involving a second embodiment will be described with reference to FIGS. 2A to 2E.

Figure 2C:
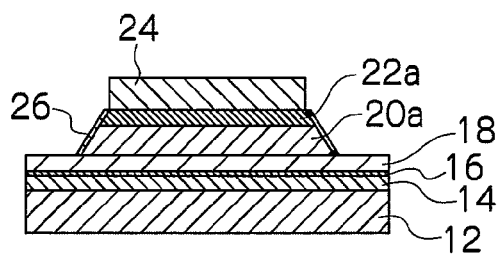

A configuration of a piezoelectric device member 10 shown in FIG. 2A is same as that shown in the first embodiment. Formation of a mask 24 shown in FIG. 2B and patterning by dry etching shown in FIG. 2C are the same as those described in the first embodiment; accordingly, explanations thereof will be omitted.

<Oxidation Process>

Figure 2D:
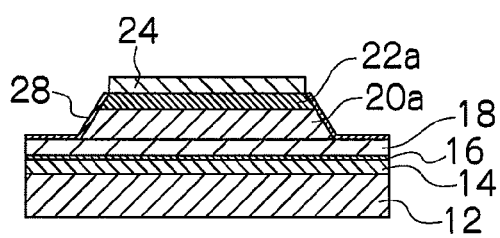

An upper electrode 22, a piezoelectric film 20 and a part of a lower electrode 18 are dry-etched through a mask 24 to pattern the upper electrode 22 and piezoelectric film 20, followed by oxidizing before a mask 24 is removed (see FIG. 2D).

Plasma oxidation is preferably conducted in the same manner as the first embodiment. While a top surface of an upper electrode 22a covered by a mask 24 is not oxidized, exposed portions of a lower electrode 18, a piezoelectric film 20a and an upper electrode 22a are each oxidized. A film (film 26 adhered to a side wall) containing a material forming the lower electrode 18 adheres to a side surface of the piezoelectric film 20a owing to over-etching during dry etching, and the film 26 adhered to the side wall is oxidized to form an insulating film 28.

<Removal of Mask>

Figure 2E:
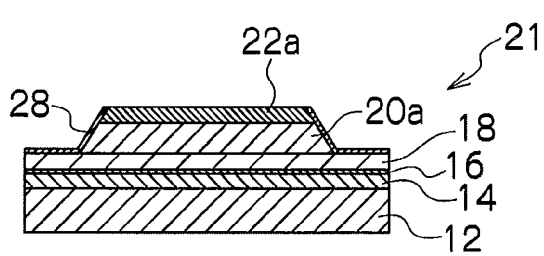

After oxidation, the mask 24 is removed (see FIG. 2E). The mask 24 may be removed by ashing with oxygen plasma similar to the first embodiment. When plasma oxidation is performed at the time of the oxidation process, the resist mask 24 is reduced by the oxygen plasma; accordingly, the mask 24 may be removed together with oxidation process.

A piezoelectric device 21 is obtained by the above processes. In the piezoelectric device 21, an oxide film (insulating film) 28 of a material forming a lower electrode 18 is formed on a side surface of the piezoelectric film 20a. Accordingly, the upper and lower electrodes 22 and 18 are inhibited from short-circuiting therebetween, and also the insulating film 28 formed on a side surface of the piezoelectric film 20a functions as a protective film, thereby obtaining a piezoelectric device with a high reliability.

The invention has been described as the above exemplary embodiments. However, the invention is not restricted to the exemplary embodiments. For instance, the piezoelectric device member is not restricted to the layer configurations exemplified in the first and second exemplary embodiments, and depending on a piezoelectric device to be produced, the layer configuration of a lower electrode, a piezoelectric film and an upper electrode laminated on a support such as a silicon substrate may be appropriately selected.

For instance, examples of materials constituting the respective electrodes, and materials constituting a piezoelectric film include the materials shown below. However, the invention is not restricted thereto.

Noble metal (respective electrodes): Pt, Ru, $RuO_2$, Ir, $IrO_2$, Au, etc.

High dielectric material (DRAM capacitor): BST: (Ba, Sr)$TiO_3$, SRO: $SrTiO_3$, BTO: $BaTiO_3$, ZnO, $ZrO_2$, $HfO_2$ Ferroelectric material (FeRAM, actuator): PZT: Pb (Zr, Ti)$O_3$, PZTN: Pb (Zr, Ti) $Nb_2O_8$, PLZT: (Pb, La) (Zr, Ti) $O_3$

What is claimed is:

1. A piezoelectric device, comprising:
   a lower electrode, a piezoelectric film and an upper electrode laminated in this order on a support,
   wherein an oxide film comprising a material that forms the lower electrode is formed on a lateral side surface of the piezoelectric film, and wherein a metallic material that forms the lower electrode is at least one of Pt, Ru or Ir.

2. The piezoelectric device of claim 1, wherein a metallic material that forms the upper electrode is at least one of Pt, Ru or Ir.

3. The piezoelectric device of claim 1, wherein the piezoelectric film comprises PZT.

4. The piezoelectric device of claim 1, wherein the support is a silicon substrate.

* * * * *